(12) United States Patent
Lin et al.

(10) Patent No.: US 12,637,733 B2
(45) Date of Patent: May 26, 2026

(54) CONNECTION PERFORMANCE UNIFORMITY IMPROVING METHOD FOR ASSEMBLY JOINT SURFACE BASED ON PARTITION HARDENING

(71) Applicant: XI'AN JIAOTONG UNIVERSITY, Xi'an (CN)

(72) Inventors: Qiyin Lin, Xi'an (CN); Nan Yang, Xi'an (CN); Jun Hong, Xi'an (CN); Yuhan Zhang, Xi'an (CN); Yicong Zhou, Xi'an (CN); Lian Liu, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 1157 days.

(21) Appl. No.: 17/585,625

(22) Filed: Jan. 27, 2022

(65) Prior Publication Data

US 2022/0275473 A1 Sep. 1, 2022

Related U.S. Application Data

(63) Continuation of application No. PCT/CN2020/095373, filed on Jun. 10, 2020.

(30) Foreign Application Priority Data

Aug. 1, 2019 (CN) .......................... 201910707693.0

(51) Int. Cl.
*C21D 10/00* (2006.01)
*G06F 30/20* (2020.01)

(52) U.S. Cl.
CPC ........... *C21D 10/005* (2013.01); *G06F 30/20* (2020.01); *C21D 2221/00* (2013.01)

(58) Field of Classification Search
CPC ............... C21D 10/009; C21D 10/005; C21D 2221/00; C21D 10/00; G06F 30/23
See application file for complete search history.

(56) References Cited

U.S. PATENT DOCUMENTS

2004/0224179 A1* 11/2004 Sokol ................... C21D 10/005
219/121.85
2006/0080069 A1 4/2006 Fujimoto
(Continued)

FOREIGN PATENT DOCUMENTS

CN 106682291 A 5/2017
CN 106709142 A 5/2017
(Continued)

OTHER PUBLICATIONS

The International Search Report in counterpart PCT Application No. PCT/CN2020/095373, dated Sep. 15, 2020.
(Continued)

*Primary Examiner* — Rehana Perveen
*Assistant Examiner* — John P Hocker

(57) ABSTRACT

A method for improving the uniformity of connection performance of an assembly surface based on zoned hardening is provided. Through a finite element contact analysis of the assembly surface, a topology optimization of the hardening layer layout of the assembly surface is carried out with the aim of improving the uniformity of the connection performance of the assembly surface. The design is based on the optimized theoretical data, and uses the laser hardening technology to realize the zoned differential hardening of the assembly surface. By performing the zoned differential hardening on the assembly surface, the uniformity of the connection performance of the assembly surface can be effectively improved, and the purpose of improving the high
(Continued)

cycle fatigue and the vibration of the high-end equipment parts such as aero-engines can be further achieved.

5 Claims, 4 Drawing Sheets

(56) References Cited

U.S. PATENT DOCUMENTS

| | | | | |
|---|---|---|---|---|
| 2009/0043228 A1* | 2/2009 | Northrop | ............. | C21D 10/005 |
| | | | | 600/585 |
| 2014/0157588 A1 | 6/2014 | Boyd et al. | | |
| 2015/0211083 A1* | 7/2015 | Gabilondo | ............ | F16C 41/008 |
| | | | | 219/121.73 |
| 2016/0216184 A1* | 7/2016 | Dubois | .................... | G01N 3/42 |
| 2021/0363605 A1* | 11/2021 | Jiang | .................... | B23K 26/356 |

FOREIGN PATENT DOCUMENTS

| | | |
|---|---|---|
| CN | 108531714 A | 9/2018 |
| CN | 109033516 A | 12/2018 |
| CN | 109063357 A | 12/2018 |
| CN | 110532632 A | 12/2019 |

OTHER PUBLICATIONS

The First Office Action in counterpart Chinese Application No. 201910707693.0, dated Oct. 12, 2020.

The Notification to Grant Patent Right for Invention in counterpart Chinese Application No. 201910707693.0, dated Apr. 6, 2021.

Yifei Hou et al., "Optimization Design for Bolted Joint Surface Shape by Contact Pressure Homogenization", Journal of Xi' an Jiaotong University, vol. 51, No. 12, Dec. 2017, pp. 84-90, DOI: 10.7652/xjtuxb201712013.

Guoqing Yang et al., "Three-dimensional Finite Element Analysis of the Mechanical Properties of Helical Thread Connection", Chinese Journal of Mechanical Engineering, vol. 26, No. 3, 2013, pp. 564-572, DOI: 10.3901/CJME.2013.03.564.

Qi-Yin Lin et al., "Effects of Texture Slip Surface on Load-Carrying Capacity and Cavitation of Bearing", Journal of South China University of Technology (Natural Science Edition), vol. 41, No. 11, Nov. 2013, pp. 85-90.

M.T. Li et al., "Experiment and Computation on the Initial Contact Force of the Rails and C-Shaped Solid Armature Interface", IEEE Xplore, Dec. 31, 2010, pp. 579-582.

* cited by examiner

*n* finite element meshes in sub-region T

Equivalent elastic modulus $E_T$

Equivalent hardening thickness $H_T$

N sub-regions (N=P×Q)

CONNECTION PERFORMANCE UNIFORMITY IMPROVING METHOD FOR ASSEMBLY JOINT SURFACE BASED ON PARTITION HARDENING

FIELD

The disclosure relates to a technology for improving the performance of an assembly surface of mechanical equipment, and in particular to a method for improving the uniformity of connection performance of an assembly surface based on zoned hardening.

BACKGROUND

Mechanical equipment is functional body assembled by several parts connected by bolts and other means; the assembly surface (also known as the assembly connection interface) between its parts is a key carrier for ensuring the desired functionalities. The uniformity of the connection performance of the assembly surface (that is, the uniformity of the distribution of contact pressure and connection stiffness on the assembly surface) plays an important role in the high-performance service of the mechanical equipment. For example, the poor uniformity of connection and stiffness of the assembly surface is one of the main causes for high cycle fatigue and excessive vibration of high-end equipment such as aero-engines. Carrying out the shape and properties design of the assembly surface has important engineering application value, for improving the connection uniformity and stiffness uniformity. Aside from the connection and fastening process of the assembly surface, and focusing on the design of the assembly surface, the surface morphology and surface hardness of the assembly surface are two important factors that affect the uniformity of the assembly connection performance. At present, the surface topography design of the assembly surface has been studied for a period of time. For example, the world's aero-engine manufacturing giants such as British Rolls Royce Company have significantly improved the overall performance of the aero-engine by designing the radial texture "micro-spline" on the assembly surface between the high-pressure turbine disk and the rear journal of the aero-engine, and effectively enhanced the competitiveness of its products in the international market. In the past, limited by the constraints of surface hardness optimization technology and surface hardness processing technology, there have been few reports on the active design of the surface hardness of assembly surface. With the development and mature application of laser surface hardening technology, it is possible to precisely control the surface differential hardening of the assembly surface. The differential hardening design provides a new technical way to improve the connection performance of the assembly surface of high-end equipment such as aero-engines.

SUMMARY

Regarding the deficiencies of the related art, the present disclosure aims to propose a method for improving the uniformity of connection performance of an assembly surface based on zoned hardening. The layout of the hardened layer is optimally designed on the assembly surface through finite element contact analysis, and then the laser hardening technology is used to achieve the differential zoned hardening on the assembly surface according to the theoretical optimization results, so as to achieve the purpose of improving the uniformity of the connection performance of the assembly surface.

In order to achieve the above purpose, the technical solutions adopted in the present disclosure are as follows.

A method for improving uniformity of connection performance of an assembly surface based on zoned hardening includes:

1) Based on a size D, which is the spot of a pulsed laser of a laser device to be used, a mating surface to be hardened of the assembly surface is divided into N sub-regions, where N=P×Q, and P and Q are integers, wherein the assembly surface adopts a non-uniform zoned hardening layout design;

2) when a sub-region T of the mating surface to be hardened includes n finite element meshes, an elastic modulus of a region of a finite element mesh i is $e_i$, an area of the region of the finite element mesh i is $s_i$, and a hardening thickness of the region of the finite element mesh i is $h_i$, the equivalent elastic modulus $E_T$ and equivalent hardening thickness $H_T$ of the sub-region T of the mating surface to be hardened are then obtained;

3) Store the equivalent elastic moduli $E_T$ and equivalent hardening thicknesses $H_T$ of the N sub-regions of the mating surface to be hardened respectively in a matrix of P×Q, that is, $[E]_{P×Q}$ and $[H]_{P×Q}$, then based on that, the pulse energies NL, pulse frequencies PL, and pulse widths MK of the pulsed laser are determined. And the pulse energies NL, the pulse frequencies PL, and the pulse widths MK of the pulsed laser are stored in a matrix of P×Q, that is, a pulse energy matrix $[NL]_{P×Q}$, a pulse frequency matrix $[PL]_{P×Q}$ and a pulse width matrix $[MK]_{P×Q}$ of the pulsed laser respectively;

4) Perform zoned laser hardening by using the zoning information matrix $[N]_{P×Q}$ of the mating surface to be hardened, the pulse energy matrix $[NL]_{P×Q}$, the pulse frequency matrix $[PL]_{P×Q}$ and the pulse width matrix $[MK]_{P×Q}$ of the pulsed laser as the control signals or parameters of laser hardening equipment.

A further improvement of the present disclosure is that in step 1), the adopted non-uniform zoned hardening layout design of the assembly surface is specified that the assembly surface includes a first mating surface and a second mating surface matching the first mating surface, and non-uniform zoned hardening could be designed on the first mating surface, the second mating surface, or both the first mating surface and the second mating surface.

A further improvement of the present disclosure is that the designing of the non-uniform zoned hardening on the first mating surface, the second mating surface, or both the first mating surface and the second mating surface includes:

(1) Establish the finite element meshes for assembly surface, set elastic moduli of the materials, and construct the finite element model for contact analysis of the assembly surface;

(2) Perform finite element contact analysis and output the contact pressure and connection stiffness of the mating surface, and calculate g the contact pressure discrete degree $\theta_p$ and the connection stiffness discrete degree $\theta_s$ respectively;

(3) Calculate the relative change rate $\Delta_p$ of the contact pressure discrete degree and the relative change rate $\Delta_s$ of the connection stiffness discrete degree between two adjacent optimization iteration steps, respectively;

(4) Construct the connection performance uniformity optimization design objective function $\Delta$, based on a weight factor c between the contact pressure discrete degree and the connection stiffness discrete degree, where an optimization design objective is min Δ;

$$\Delta = -[c \cdot \Delta_p + (1-c) \cdot \Delta_s], c \in [0,1]$$

(5) terminating optimization, and outputting and saving elastic modulus data of the materials, when the connection performance uniformity optimization design objective function Δ satisfies Δ≤ε, or a number k of optimization iteration steps satisfies k≤N; otherwise, performing step (6);

(6) Define a region where a zoned hardening optimization design is to be carried out, take the elastic modulus of the material of the region as design variable, and set an acceleration constant factor α and a relaxation constant factor β. In a new optimization iteration step (k+1), optimize and update the elastic modulus of the material of the zoned hardening optimization design region;

(7) Update the finite element model of the assembly surface described in step (1) based on the new value of the elastic modulus of the material obtained in step (6), and perform a new finite element contact analysis.

A further improvement of the present disclosure is that, in step (3), the relative change rate $\Delta_p$ of the contact pressure discrete degree and the relative change rate $\Delta_s$ of the connection stiffness discrete degree between the two adjacent optimization iteration steps are calculated as follows, $$\Delta_p = \frac{\theta_p^k - \theta_p^{k-1}}{\theta_p^{k-1}},$$

$$\Delta_s = \frac{\theta_s^k - \theta_s^{k-1}}{\theta_s^{k-1}},$$

where $$\theta_p^k$$

denotes a contact pressure discrete degree at k-th iteration step, $$\theta_p^{k-1}$$

denotes a contact pressure discrete degree at (k−1)-th iteration step, $$\theta_s^k$$

denotes a contact stiffness discrete degree at k-th iteration step, and $$\theta_s^{k-1}$$

denotes a contact stiffness discrete degree at (k−1)-th iteration step.

A further improvement of the present disclosure is that, in step (4), the weight factor c between the contact pressure discrete degree and the connection stiffness discrete degree ranges from 0 to 1.

4

A further improvement of the present disclosure is that, in step (6), the elastic modulus of the material of the zoned hardening optimization design region is optimized and updated by using one of following two formulas:

$$e_j^{k+1} = e_j^k - \alpha \cdot \partial \frac{c \cdot \theta_p + (1-c) \cdot \theta_s}{\partial e_j} \cdot e_j^k,$$

$$e_j^{k+1} = \beta \times e_j^0 \times \left[ c \cdot \frac{\sigma_{max}^k}{\sigma_j^k} + (1-c) \frac{\delta_{max}^k}{\delta_j^k} \right] \times \left[ c \cdot \frac{\sigma_{min}^k}{\sigma_j^k} + (1-c) \frac{\delta_{min}^k}{\delta_j^k} \right],$$

where $e_j$ denotes an elastic modulus of a finite element mesh j in a design domain, where j=1, 2, 3, ..., M, and M denotes a total number of finite element meshes in the design domain, σ denotes an element Von Mises stress, and $\sigma_{max}$ and $\sigma_{min}$ denote the maximum and minimum values of the element Von Mises stress on a contact interface, δ denotes an element connection stiffness, and $\delta_{max}$ and $\delta_{min}$ denote maximum and minimum values of the element connection stiffness on the contact interface.

A further improvement of the present disclosure is that, in step 1), a length L and a width W of each sub-region are 1 to 3 times the size D of the spot of the pulsed laser.

A further improvement of the present disclosure is that, in step 2), the equivalent elastic modulus $E_T$ and the equivalent hardening thickness $H_T$ of the sub-region T of the mating surface to be hardened are defined as follows:

$$E_T = \frac{\sum_{i=0}^n (e_i \cdot s_i)}{\sum_{i=0}^n s_i}, T = 1, 2, 3, \ldots, N; \text{ and}$$

$$H_T = \sum_{i=0}^n (h_i \cdot s_i) \bigg/ \sum_{i=0}^n s_i, T = 1, 2, 3, \ldots, N.$$

Compared with the related art, the beneficial effects of the present disclosure are that: the present disclosure optimizes the hardened layer layout of the assembly surface based on the finite element contact analysis. Based on the size D, which is the spot of a pulsed laser of a laser device to be used, a mating surface to be hardened of the assembly surface is divided into N sub-regions. Based on the equivalent elastic moduli and the equivalent hardening thicknesses of materials of the N sub-regions of the mating surface to be hardened, pulse energies, pulse frequencies, and pulse widths of the pulsed laser are determined. Zoned laser hardening is performed by using a zoning information matrix of the mating surface to be hardened, and the pulse energy matrix, the pulse frequency matrix and the pulse width matrix of the pulsed laser are taken as the control signals or parameters of laser hardening equipment. In this way, the connection uniformity and stiffness uniformity of the assembly surface can be effectively improved, and high cycle fatigue and vibration of high-end equipment such as aero-engines can be improved.

1 is the first mating surface, 2 is the second mating surface, and 3 is the hardening region.

DESCRIPTION OF EMBODIMENTS

The present disclosure will be further described below in conjunction with the accompanying diagrams.

The present disclosure is described by taking an assembly surface of flanges connected by bolts (see FIG. 1) as an example.

In the present disclosure, the assembly surface adopts a non-uniform zoned hardening layout design.

Figures 1, 2, 3:
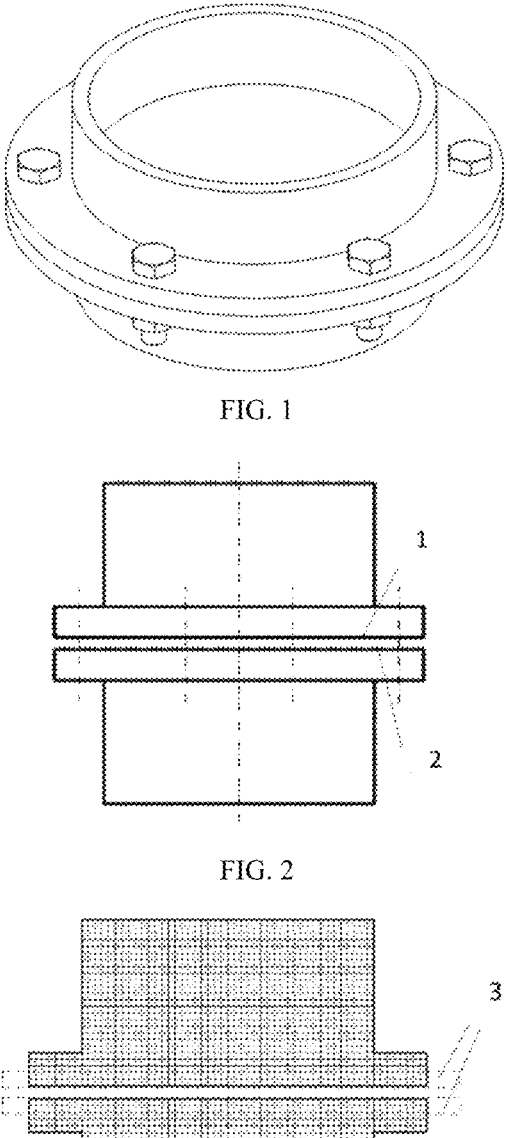
FIG. 1 is a schematic diagram of flanges connected by bolts.
FIG. 2 is a schematic diagram of a flange assembly surface.
FIG. 3 is a diagram of a finite element mesh model of a flange assembly surface.

Referring to FIG. 2, the assembling surface includes a first mating surface 1 and a second mating surface 2 matching the first matching surface 1, and the non-uniform zoned hardening is designed on the first mating surface 1, the second mating surface 2 or both the first mating surface 1 and the second mating surface 2.

The steps for the non-uniform zoned hardening design are as follows.

(1) Referring to FIG. 3, finite element meshes are generated for the assembly surface, elastic moduli of the materials are set, and a finite element model for contact analysis of the assembly surface is then constructed.

(2) Finite element contact analysis is performed to obtain contact pressure values and connection stiffness values of the mating surface, and a contact pressure discrete degree $\theta_p$ and a connection stiffness discrete degree $\theta_s$ are calculated respectively, based on the contact pressure values and connection stiffness values.

(3) A relative change rate $\Delta_p$ of the contact pressure discrete degree and a relative change rate $\Delta_p$ of the connection stiffness discrete degree between two adjacent optimization iteration steps are respectively calculated by, $$\Delta_p = \frac{\theta_p^k - \theta_p^{k-1}}{\theta_p^{k-1}}, \text{ and}$$

$$\Delta_s = \frac{\theta_s^k - \theta_s^{k-1}}{\theta_s^{k-1}},$$

where $$\theta_p^k$$

denotes a contact pressure discrete degree at k-th iteration step, $$\theta_p^{k-1}$$

denotes a contact pressure discrete degree at (k−1)-th iteration step, $$\theta_s^k$$

denotes a contact stiffness discrete degree at k-th iteration step, and $$\theta_s^{k-1}$$

denotes a contact stiffness discrete degree at (k−1)-th iteration step.

(4) A weighting factor c ($0 \leq c \leq 1$) between the contact pressure discrete degree and the connection stiffness discrete degree is set, and a mathematical expression α that characterizes the uniformity of the connection performance of the mating surface is constructed, where an optimization design objective is min Δ, $$\Delta = -[c \cdot \Delta_p + (1-c) \cdot \Delta_s], c \in [0,1].$$

(5) When the connection performance uniformity optimization design objective function Δ satisfies Δ≤ε, or a number k of optimization iteration steps satisfies k≤N, where ε is a small constant value that is generally set to $10^{-3}$, $10^{-4}$ or $10^{-5}$ to control convergence, and N is a maximum allowed number of iteration steps, the optimization is terminated, and elastic modulus data of the materials are output and saved; if neither of the above two conditions are satisfied, step (6) is performed;

(6) Define the region where a zoned hardening optimization design is to be carried out, that is, the hardening region 3 (see FIG. 3), is set. Generally, the region with a distance of 0.5 mm to 5 mm from the assembly surface is set as the hardening optimization design region. An elastic modulus of a material is taken as the design variable in a theoretical analysis, and an acceleration constant factor α and a relaxation constant factor β are set. In a new optimization iteration step (k+1), the elastic modulus of the material of the zoned hardening optimization design region is optimized and updated by using one of following two formulas:

$$e_j^{k+1} = e_j^k - \alpha \cdot \partial \frac{c \cdot \theta_p + (1-c) \cdot \theta_s}{\partial e_j} \cdot e_j^k,$$

$$e_j^{k+1} = \beta \times e_j^0 \times \left[ c \cdot \frac{\sigma_{max}^k}{\sigma_j^k} + (1-c) \frac{\delta_{max}^k}{\delta_j^k} \right] \times \left[ c \cdot \frac{\sigma_{min}^k}{\sigma_j^k} + (1-c) \frac{\delta_{min}^k}{\delta_j^k} \right],$$

where $e_j$ denotes an elastic modulus of a finite element mesh j in a design domain, where j=1, 2, 3, . . . , M, and M denotes a total number of finite element meshes in the design domain, $\sigma$ denotes an element Von Mises stress, and $\sigma_{max}$ and $\sigma_{min}$ denote maximum and minimum values of the element Von Mises stress on a contact interface, $\delta$ denotes an element connection stiffness, and $\delta_{max}$ and $\delta_{min}$ denote maximum and minimum values of the element connection stiffness on the contact interface.

(7) The finite element model of the assembly surface described in step (1) is updated based on the new value of the elastic modulus of the material obtained in step (6), and a new finite element contact analysis and optimization design is performed, that is, the analysis from steps (2) to (6) is repeated.

For the non-uniform zoned hardening layout, after the above design on the mating surface, the corresponding processing and manufacturing steps include the followings.

Figure 4:
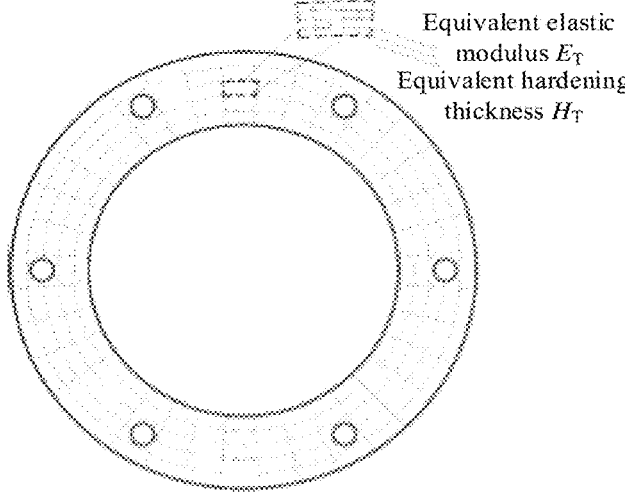
FIG. 4 is a schematic diagram of a mating surface to be hardened.

(1) Based on the size D, which is the spot of a pulsed laser of a laser device to be used, a mating surface to be hardened of the assembly surface is divided into N sub-regions (N=P×Q, P and Q are integers, and values of P and Q are determined by a structure size and a spot size, see FIG. 4), and a length L and a width W of each sub-region are 1 to 3 times the size D of the spot of the pulsed laser.

(2) The elastic modulus data of the materials saved in the above step (5) is stored based on the finite element meshes; when a sub-region T of the mating surface to be hardened includes n finite element meshes (see FIG. 4), the elastic modulus of a region of a finite element mesh i is $e_i$, the area of the region of the finite element mesh i is $s_i$, and the hardening thickness of the region of the finite element mesh i is $h_i$, the calculation formulas of equivalent elastic moduli $E_T$ and equivalent hardening thicknesses $H_T$ of the sub-region T of the mating surface to be hardened are as follows:

$$E_T = \frac{\sum_{i=0}^{n}(e_i \cdot s_i)}{\sum_{i=0}^{n} s_i}, T = 1, 2, 3, \dots, N,$$

$$H_T = \sum_{i=0}^{n}(h_i \cdot s_i) \bigg/ \sum_{i=0}^{n} s_i, T = 1, 2, 3, \dots, N.$$

(3) The equivalent elastic moduli $E_T$ and the equivalent hardening thicknesses $H_T$ of the N sub-regions of the mating surface to be hardened are respectively stored in a matrix of P×Q, that is, $[E]_{P \times Q}$ and $[H]_{P \times Q}$; based on the equivalent elastic moduli and the equivalent hardening thicknesses, the pulse energies NL, pulse frequencies PL, and pulse widths MK of the pulsed laser are determined. And the pulse energies NL, the pulse frequencies PL, and the pulse widths MK of the pulsed laser are respectively stored in a matrix of P×Q, that is, a pulse energy matrix $[NL]_{P \times Q}$, a pulse frequency matrix $[PL]_{P \times Q}$ and a pulse width matrix $[MK]_{P \times Q}$ of the pulsed laser.

(4) Zoned laser hardening is performed by using a zoning information matrix $[N]_{P \times Q}$ of the mating surface to be hardened, and the pulse energy matrix $[NL]_{P \times Q}$, the pulse frequency matrix $[PL]_{P \times Q}$ and the pulse width matrix $[MK]_{P \times Q}$ of the pulsed laser are taken as the control signals or parameters of laser hardening equipment.

The contact pressure discrete degree described in the present disclosure can be characterized by either a variance of the contact pressure on the mating surface or a range of the contact pressure on the mating surface.

The connection stiffness discrete degree described in the present disclosure can be characterized by either a variance of the connection stiffness on the mating surface or a range of the connection stiffness on the mating surface.

By introducing the weighting factor c, the uniformity of the connection performance can be characterized by the uniformity of the contact pressure distribution only (c=1), by the uniformity of the connection stiffness distribution only (c=0), or by both the uniformity of the contact pressure distribution and the uniformity of the connection stiffness distribution (0<c<1).

Figure 5:
FIG. 5 is a diagram of a finite element mesh model for contact analysis of an assembly surface of a high-pressure rotor spigot of an aero-engine connected by bolts.
Figure 6:
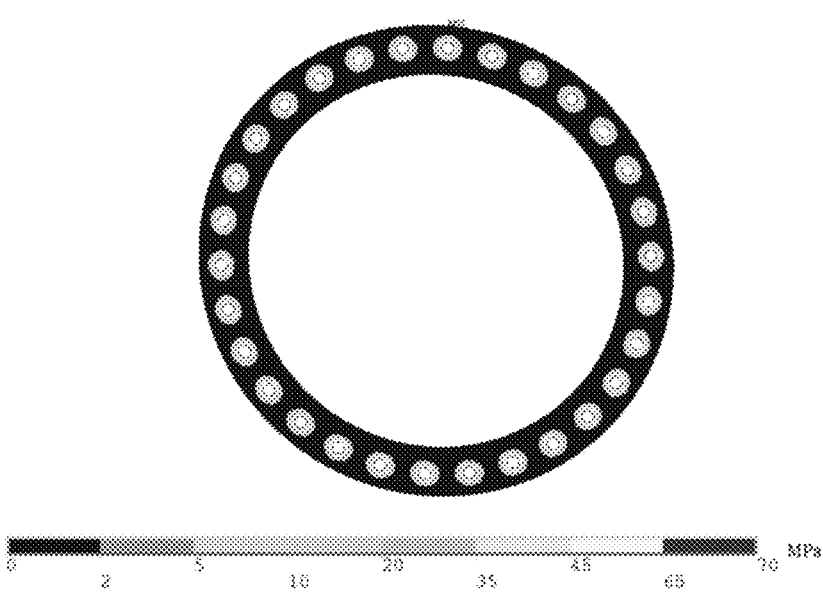
FIG. 6 is a cloud diagram of a contact pressure distribution of the assembly surface of the high-pressure rotor spigot connected by bolts shown in FIG. 5 before differential hardening design.
Figures 7, 8:
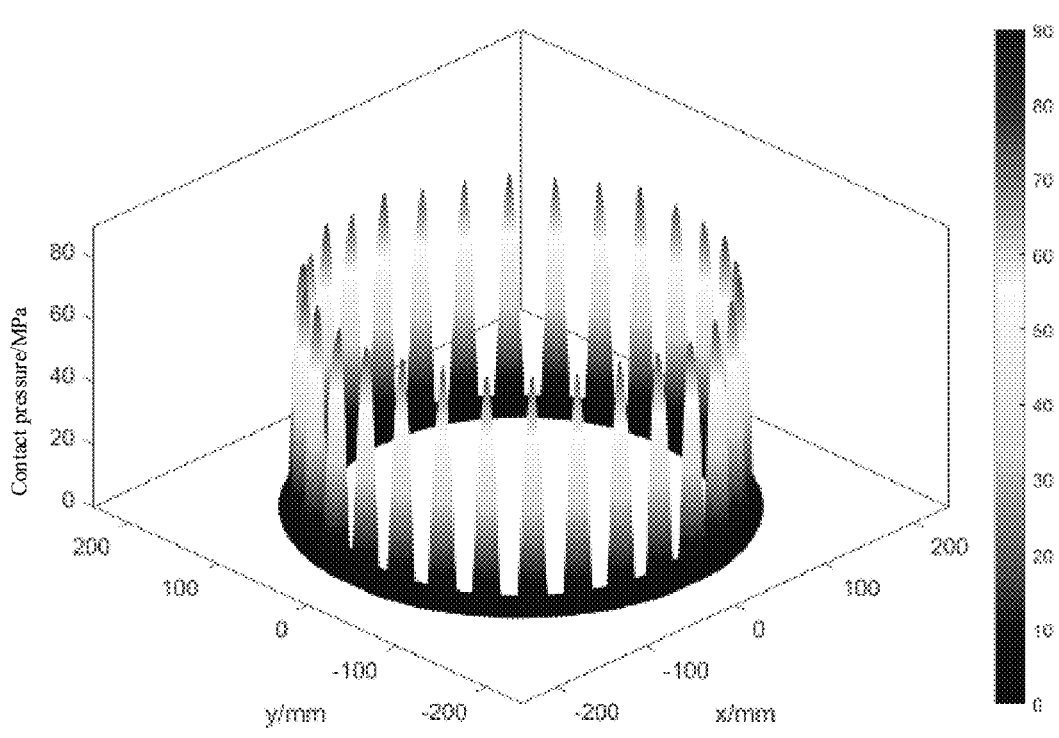
FIG. 7 is a three-dimensional distribution diagram of a contact pressure of the assembly surface of the high-pressure rotor spigot connected by bolts shown in FIG. 5 before differential hardening design.
FIG. 8 is a cloud diagram of a contact pressure distribution of the assembly surface of the high-pressure rotor spigot connected by bolts shown in FIG. 5 after differential hardening design.
Figure 9:
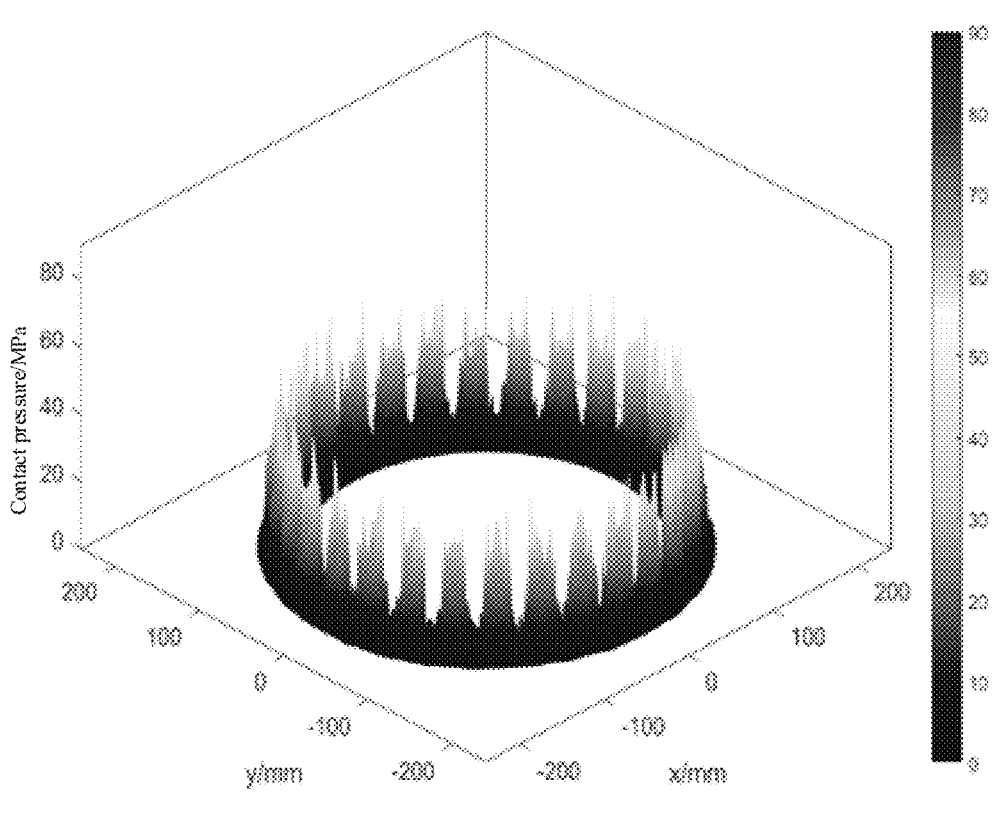
FIG. 9 is a three-dimensional distribution diagram of a contact pressure of the assembly surface of the high-pressure rotor spigot connected by bolts shown in FIG. 5 after differential hardening design.

The beneficial effects of the present disclosure are further illustrated by taking the differential hardening design of an assembly surface of a high-pressure rotor spigot of a certain type of aero-engine connected by bolts as an example. The finite element mesh model of an assembly surface of a high-pressure rotor spigot of a certain type of aero-engine connected by bolts is shown in FIG. 5. Since the assembly surface of the high-pressure rotor spigot connected by bolts is a 360° symmetrical structure, in order to clearly show the internal structure of the assembly connection, FIG. 5 only shows a finite element mesh model of a half (i.e. 180°) of the high pressure rotor spigot connected by bolts. The pre-tightening force applied by each connecting bolt is 9 kN. Before the differential hardening design of the assembly surface, the contact pressure distribution at the assembly surface is shown in FIG. 6 and FIG. 7; and after the differential hardening design of the assembly surface, the contact pressure distribution at the assembly surface is shown in FIG. 8 and FIG. 9. Comparing between FIG. 6 and FIG. 8, FIG. 7 and FIG. 9, it can be clearly seen that after the differential hardening design, the peak value of the contact pressure at the assembly surface is significantly reduced, the uniformity of the contact pressure distribution is significantly improved, and the uniformity of the contact pressure distribution has increased by 42.75% and the actual contact area has increased by 97.8%. It can be seen that the differential hardening design technology can effectively improve the connection performance of the assembly surface. In the disclosure, the hardening layer layout on the assembly surface is designed based on the finite element contact analysis, and the zoned differential hardening of the assembly surface is realized by using the laser hardening technology, which can effectively improve the connection uniformity and stiffness uniformity of the assembly surface, and improve the high cycle fatigue and vibration of high-end equipment such as aero-engines.

At present, the idea of designing uniform surface hardness of the assembly surface is adopted in engineering, and the description and characterization of the design points of surface hardness in engineering drawings are relative with little content and lack of design connotations, which are far from meeting the design requirements of high-performance assembly surfaces for high-end equipment such as aero-engines. "I-Ching" says: "rigidness and softness adjusting each other". "Tao Te Ching" says: "All things leave behind them the Obscurity (out of which they have come), and go forward to embrace the Brightness (into which they have emerged), while they are harmonized by the Breath of Vacancy." Philosophical thought is the production practice law and material and spiritual wealth condensed and summarized by human beings in the historical development of social and economic production through continuous exploration, continuous trial and error, continuous creation and continuous accumulation. The Chinese philosophy of "combining rigidity and softness" is broad and profound, and contains very profound design connotations. Only when rigidity and softness are combined, can they complement each other! The present disclosure introduces the design scientific connotation contained in the philosophical thought of "combining rigidity and flexibility"—surface differential design ("simultaneity") of high-hardness ("rigidness") and low-hardness ("softness") into the design of the mechanical assembly surface. The "rigidness" and "softness" structures cooperate with each other to achieve load equalization, prevent stress concentration, and achieve uniform connection performance, which has important scientific significance.

The above embodiments are only to illustrate the technical idea of the present disclosure, and cannot limit the protection scope of the present disclosure. Any changes made on the basis of the technical solutions according to the technical idea proposed by the present disclosure also fall into the protection scope of the present disclosure. The technology not involved in the present disclosure can be realized by the existing technology.

What is claimed is:

1. A method for improving uniformity of connection performance of assembly surfaces based on zoned hardening, comprising:

1) Dividing, based on a size D, which is a spot of a pulsed laser of a laser device to be used, a mating surface to be hardened of the assembly surfaces into N sub-regions, where N=P×Q, and P and Q are integers, wherein the assembly surface adopts surfaces adopt a non-uniform zoned hardening layout;

2) obtaining, when a sub-region T of the mating surface to be hardened comprises a number n of finite element meshes, an elastic modulus of a region of a finite element mesh i is $e_i$, an area of the region of the finite element mesh i is $s_i$, and a hardening thickness of the region of the finite element mesh i is $h_i$, an equivalent elastic modulus $E_T$ and an equivalent hardening thickness $H_T$ of the sub-region T of the mating surface to be hardened;

3) storing the equivalent elastic moduli $E_T$ and the equivalent hardening thicknesses $H_T$ of the N sub-regions of the mating surface to be hardened respectively in a matrix of P×Q, that is, $[E]_{P\times Q}$ and $[H]_{P\times Q}$; determining, then based on that, pulse energies NL, pulse frequencies PL, and pulse widths MK of the pulsed laser, and storing the pulse energies NL, the pulse frequencies PL, and the pulse widths MK of the pulsed laser respectively in a matrix of P×Q, that is, a pulse energy matrix $[NL]_{P\times Q}$, a pulse frequency matrix $[PL]_{P\times Q}$ and a pulse width matrix $[MK]_{P\times Q}$ of the pulsed laser; and 4) performing zoned laser hardening, by laser hardening equipment, by using a zoning information matrix $[N]_{P\times Q}$ of the mating surface to be hardened, the pulse energy matrix $[NL]_{P\times Q}$, the pulse frequency matrix $[PL]_{P\times Q}$ and the pulse width matrix $[MK]_{P\times Q}$ of the pulsed laser as control signals or parameters of the laser hardening equipment, wherein in step 1), the adopted non-uniform zoned hardening layout of the assembly surfaces is specified that: the assembly surfaces comprise a first mating surface and a second mating surface matching the first mating surface, and non-uniform zoned hardening is designed on the first mating surface, the second mating surface, or both the first mating surface and the second mating surface, wherein the designing of the non-uniform zoned hardening on the first mating surface, the second mating surface, or both the first mating surface and the second mating surface comprises:

(A) dividing finite element meshes for the assembly surfaces, setting elastic moduli of the materials, and constructing a finite element model for contact analysis of the assembly surfaces;

(B) performing finite element contact analysis and outputting contact pressure and connection stiffness of the mating surface, and respectively calculating a contact pressure discrete degree $\theta_p$ and a connection stiffness discrete degree $\theta_s$;

(C) respectively calculating a relative change rate $\Delta_p$ of the contact pressure discrete degree and a relative change rate $\Delta_s$ of the connection stiffness discrete degree between two adjacent optimization iteration steps;

(D) constructing a connection performance uniformity optimization design objective function $\Delta$, based on a weight factor c between the contact pressure discrete degree and the connection stiffness discrete degree, where an optimization design objective is min$\Delta$, where the connection performance uniformity optimization design objective function $\Delta$ is calculated as follows, $$\Delta = -[c \cdot \Delta_p + (1-c) \cdot \Delta_s], c \in [0,1];$$

(E) terminating optimization, and outputting and saving elastic modulus data of the materials, when the connection performance uniformity optimization design objective function $\Delta$ satisfies $\Delta \leq \varepsilon$, or a number k of optimization iteration steps satisfies $k \leq N$; otherwise, performing step (F) and step (G);

(F) defining a region where a zoned hardening optimization design is to be carried out, taking an elastic modulus of a material of the region as an optimization design variable, setting an acceleration constant factor $\alpha$ and a relaxation constant factor $\beta$, and in a new optimization iteration step (k+1), optimizing and updating the elastic modulus of the material of the zoned hardening optimization design region; and (G) updating the finite element model of the assembly surfaces described in step (A) based on a new value of the elastic modulus of the material obtained in step (F), and performing a new finite element contact analysis, and wherein in step (F), the elastic modulus of the material of the zoned hardening optimization design region is optimized and updated by using one of following two formulas:

$$e_j^{k+1} = e_j^k - \alpha \cdot \partial \frac{c \cdot \theta_p + (1-c) \cdot \theta_s}{\partial e_j} \cdot e_j^k,$$

$$e_j^{k+1} = \beta \times e_j^0 \times \left[ c \cdot \frac{\sigma_{max}^k}{\sigma_j^k} + (1-c) \frac{\delta_{max}^k}{\delta_j^k} \right] \times \left[ c \cdot \frac{\sigma_{min}^k}{\sigma_j^k} + (1-c) \frac{\delta_{min}^k}{\delta_j^k} \right],$$

where $e_j$ denotes an elastic modulus of a finite element mesh j in a design domain, where j=1, 2, 3, . . . , M, and M denotes a total number of finite element meshes in the design domain, $\sigma$ denotes an element Von Mises stress, and $\sigma_{max}$ and $\sigma_{min}$ denote maximum and minimum values of the element Von Mises stress on a contact interface, $\delta$ denotes an element connection stiffness, and $\delta_{max}$ and $\delta_{min}$ denote maximum and minimum values of the element connection stiffness on the contact interface.

2. The method according to claim 1, wherein in step (C), the relative change rate $\Delta_p$ of the contact pressure discrete degree and the relative change rate $\Delta_s$ of the connection stiffness discrete degree between the two adjacent optimization iteration steps are calculated as follows, $$\Delta_p = \frac{\theta_p^k - \theta_p^{k-1}}{\theta_p^{k-1}},$$

$$\Delta_s = \frac{\theta_s^k - \theta_s^{k-1}}{\theta_s^{k-1}},$$

where $$\theta_p^k$$

denotes a contact pressure discrete degree at k-th iteration step, $$\theta_p^{k-1}$$

denotes a contact pressure discrete degree at (k−1)-th iteration step, $$\theta_s^k$$

denotes a contact stiffness discrete degree at k-th iteration step, and $$\theta_s^{k-1}$$

denotes a contact stiffness discrete degree at (k−1)-th iteration step.

3. The method according to claim 1, wherein in step (D), the weight factor c between the contact pressure discrete degree and the connection stiffness discrete degree ranges from 0 to 1.

4. The method according to claim 1, wherein in step 1), a length L and a width W of each sub-region are 1 to 3 times the size D of the spot of the pulsed laser.

5. The method according to claim 1, wherein in step 2), the equivalent elastic modulus $E_T$ and the equivalent hardening thickness $H_T$ of the sub-region T of the mating surface to be hardened are defined as follows:

$$E_T = \frac{\sum_{i=0}^{n}(e_i \cdot s_i)}{\sum_{i=0}^{n} s_i}, T = 1, 2, 3, \dots, N; \text{ and}$$

$$H_T = \sum_{i=0}^{n}(h_i \cdot s_i) \Big/ \sum_{i=0}^{n} s_i, T = 1, 2, 3, \dots, N.$$

\* \* \* \* \*